United States Patent
Hao et al.

(10) Patent No.: US 11,522,025 B2
(45) Date of Patent: Dec. 6, 2022

(54) POLYMERIC FILMS AND DISPLAY DEVICES CONTAINING SUCH FILMS

(71) Applicant: 3M INNOVATIVE PROPERTIES COMPANY, St. Paul, MN (US)

(72) Inventors: Encai Hao, Woodbury, MN (US); Zhaohui Yang, North Oaks, MN (US); Albert I. Everaerts, Tucson, AZ (US); Yongshang Lu, Woodbury, MN (US); William Blake Kolb, Stillwater, MN (US); Keith R. Bruesewitz, River Falls, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 60 days.

(21) Appl. No.: 16/610,710

(22) PCT Filed: May 3, 2018

(86) PCT No.: PCT/US2018/030954
§ 371 (c)(1),
(2) Date: Nov. 4, 2019

(87) PCT Pub. No.: WO2018/204693
PCT Pub. Date: Nov. 8, 2018

(65) Prior Publication Data
US 2020/0152715 A1      May 14, 2020

Related U.S. Application Data

(60) Provisional application No. 62/502,117, filed on May 5, 2017.

(51) Int. Cl.
H01L 27/32     (2006.01)
C09J 7/10      (2018.01)

(52) U.S. Cl.
CPC .......... *H01L 27/3241* (2013.01); *C09J 7/10* (2018.01); *C09J 2301/302* (2020.08)

(58) Field of Classification Search
CPC .... H01L 27/3241; H01L 51/5268; C09J 7/00; C09J 7/10; C09J 11/00; C09J 123/22;
(Continued)

(56) References Cited

U.S. PATENT DOCUMENTS 8,232,350 B2   7/2012  Fujita
8,557,378 B2  10/2013  Yamanaka
(Continued)

FOREIGN PATENT DOCUMENTS

WO   WO 2008-128073    10/2008
WO   WO 2010-033558     3/2010
(Continued)

OTHER PUBLICATIONS

International Search report for PCT International Application No. PCT/US2018/030954 dated Sep. 6, 2018, 4 pages.

*Primary Examiner* — Mary A Wilczewski

(57) ABSTRACT

Polymeric films, which may be adhesive films, and display devices including such polymeric films, wherein a polymeric film includes: a first polymeric layer having two major surfaces, wherein the first polymeric layer includes a first polymeric matrix and particles. The first polymeric layer includes: a first a polyolefin-based low WVTR adhesive polymeric matrix having a refractive index $n_1$; and particles having a refractive index $n_2$ uniformly dispersed within the first polymeric matrix; wherein the particles are present in an amount of less than 30 vol-%, based on the volume of the first polymeric layer, and have a particle size range of 400 nanometers (nm) to 3000 nm; and wherein $n_1$ is different than $n_2$.

17 Claims, 4 Drawing Sheets

(58) Field of Classification Search
CPC ...... C09J 125/06; C09J 133/12; C09J 175/04; C09J 183/04; C09J 2301/208; C09J 2301/302; C09J 2301/312; C09J 2301/408; C09J 2203/318; C09J 2203/326; C09J 2423/00
See application file for complete search history.

(56) References Cited

U.S. PATENT DOCUMENTS

| | | | |
|---|---|---|---|
| 9,960,389 B1 | 5/2018 | Hao | |
| 10,011,742 B2* | 7/2018 | Keite-Telgenbuscher | C09J 7/22 |
| 2004/0216778 A1* | 11/2004 | Ferri | B32B 17/10174 136/251 |
| 2005/0147813 A1 | 7/2005 | Gotz | |
| 2009/0087629 A1 | 4/2009 | Everaerts | |
| 2009/0089137 A1 | 4/2009 | Mined | |
| 2010/0028564 A1 | 2/2010 | Cheng | |
| 2010/0040842 A1 | 2/2010 | Everaerts | |
| 2010/0068514 A1* | 3/2010 | Ellinger | C09J 153/025 428/351 |
| 2011/0036623 A1* | 2/2011 | Keite-Telgenbuscher | C09J 153/025 174/260 |
| 2011/0121356 A1* | 5/2011 | Krawinkel | C09J 153/005 257/100 |
| 2011/0126968 A1 | 6/2011 | Determan | |
| 2011/0163403 A1 | 7/2011 | Bhatia | |
| 2012/0128966 A1 | 5/2012 | Ma | |
| 2012/0285618 A1 | 11/2012 | Bharti | |
| 2013/0105770 A1 | 5/2013 | Pschenitzka | |
| 2014/0299844 A1 | 10/2014 | You | |
| 2014/0315016 A1* | 10/2014 | Dollase | B32B 7/12 428/339 |
| 2015/0162568 A1* | 6/2015 | Bai | C09J 7/10 438/28 |
| 2015/0329747 A1 | 11/2015 | Cho | |
| 2016/0001521 A1 | 1/2016 | Tanaka | |
| 2016/0155967 A1 | 6/2016 | Lee | |
| 2016/0155987 A1 | 6/2016 | Yoo | |
| 2017/0101556 A1 | 4/2017 | Keite-Telgenbuscher | |
| 2020/0152715 A1* | 5/2020 | Hao | H01L 27/3241 |

FOREIGN PATENT DOCUMENTS

| | | | |
|---|---|---|---|
| WO | WO 2018-204648 | 11/2018 | |
| WO | WO 2018/204693 | * 11/2018 | ................ C09J 7/00 |

* cited by examiner

POLYMERIC FILMS AND DISPLAY DEVICES CONTAINING SUCH FILMS

BACKGROUND

Organic light emitting diodes (OLEDs) currently are used in small-screen devices such as cell phones, personal display devices (PDAs), and digital cameras. Current OLED markets are dominated by active-matrix organic light-emitting diode (AMOLED) handhelds, which have a top-emissive architecture and currently do not use any light extraction method except for employing strong microcavity. This strong cavity design can have high light efficiency, but the angular color uniformity is much worse, when compared to that of liquid crystal displays (LCDs).

Typically, the color for an OLED screen shifts greatly as viewing angle increases away from normal incidence, but an LCD display shifts only slightly. This is a visually evident difference between the two display technologies. How to improve the angular color uniformity remains a challenge for AMOLED displays with strong cavity design.

SUMMARY OF THE DISCLOSURE

The present disclosure provides polymeric films, which may be adhesive films, and display devices including such polymeric films.

In one embodiment, a polymeric film includes: a first polymeric layer having two major surfaces, wherein the first polymeric layer includes a first polymeric matrix and particles (preferably, polymeric particles). The polymeric film has: a clarity of at least 80%; a visible light transmission of at least 85%; and a bulk haze of 15% to 80%.

Such a prescribed polymeric film has the optical function of a very moderate optical diffuser with controlled local uniformity.

The first polymeric layer includes: a first polyolefin-based low water vapor transmission rate (WVTR) adhesive polymeric matrix having a refractive index $n_1$; and particles having a refractive index $n_2$ uniformly dispersed within the first polymeric matrix; wherein the particles are present in an amount of less than 30 vol-%, based on the volume of the first polymeric layer, and have a particle size range of 400 nanometers (nm) to 3000 nm; and wherein $n_1$ is different than $n_2$.

In one embodiment, a display device includes: an organic light emitting diode panel having a multi-layer construction that includes one or more adhesive films; and a polymeric film as described herein incorporated within the multi-layer construction of the organic light emitting diode panel (e.g., within an adhesive film or as a replacement for an adhesive film).

The term "haze" refers to wide angle light scattering, wherein light emitting from a display is diffused in all directions causing a loss of contrast. More particularly, the term "bulk haze" refers to the wide angle light scatter measured with a broad sampling beam of several millimeters (mm) so as to give an average result from said several-mmillimeter aperture of the polymeric film.

The term "clarity" refers to narrow angle scattering, wherein light is diffused in a small angle range with high concentration. The effect of having a certain clarity basically describes how well very small details can be seen through a specimen.

The terms "polymer" and "polymeric material" include, but are not limited to, organic homopolymers, copolymers, such as for example, block, graft, random, and copolymers, terpolymers, etc., and blends and modifications thereof. Furthermore, unless otherwise specifically limited, the term "polymer" shall include all possible geometrical configurations of the material. These configurations include, but are not limited to, isotactic, syndiotactic, and atactic symmetries.

Herein, the term "comprises" and variations thereof do not have a limiting meaning where these terms appear in the description and claims. Such terms will be understood to imply the inclusion of a stated step or element or group of steps or elements but not the exclusion of any other step or element or group of steps or elements. By "consisting of" is meant including, and limited to, whatever follows the phrase "consisting of." Thus, the phrase "consisting of" indicates that the listed elements are required or mandatory, and that no other elements may be present. By "consisting essentially of" is meant including any elements listed after the phrase, and limited to other elements that do not interfere with or contribute to the activity or action specified in the disclosure for the listed elements. Thus, the phrase "consisting essentially of" indicates that the listed elements are required or mandatory, but that other elements are optional and may or may not be present depending upon whether or not they materially affect the activity or action of the listed elements.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure.

In this application, terms such as "a," "an," and "the" are not intended to refer to only a singular entity, but include the general class of which a specific example may be used for illustration. The terms "a," "an," and "the" are used interchangeably with the term "at least one." The phrases "at least one of" and "comprises at least one of" followed by a list refers to any one of the items in the list and any combination of two or more items in the list.

As used herein, the term "or" is generally employed in its usual sense including "and/or" unless the content clearly dictates otherwise.

The term "and/or" means one or all of the listed elements or a combination of any two or more of the listed elements.

Also herein, all numbers are assumed to be modified by the term "about" and in certain embodiments, preferably, by the term "exactly." As used herein in connection with a measured quantity, the term "about" refers to that variation in the measured quantity as would be expected by the skilled artisan making the measurement and exercising a level of care commensurate with the objective of the measurement and the precision of the measuring equipment used. Herein, "up to" a number (e.g., up to 50) includes the number (e.g., 50).

Also herein, the recitations of numerical ranges by endpoints include all numbers subsumed within that range as well as the endpoints (e.g., 1 to 5 includes 1, 1.5, 2, 2.75, 3, 3.80, 4, 5, etc.).

As used herein, the term "room temperature" refers to a temperature of 20° C. to 25° C., or in certain embodiments, 22° C. to 25° C.

The term "in the range" or "within a range" (and similar statements) includes the endpoints of the stated range.

Groupings of alternative elements or embodiments disclosed herein are not to be construed as limitations. Each group member may be referred to and claimed individually or in any combination with other members of the group or other elements found therein. It is anticipated that one or more members of a group may be included in, or deleted from, a group for reasons of convenience and/or patentability. When any such inclusion or deletion occurs, the specification is herein deemed to contain the group as modified thus fulfilling the written description of all Markush groups used in the appended claims.

Reference throughout this specification to "one embodiment," "an embodiment," "certain embodiments," or "some embodiments," etc., means that a particular feature, configuration, composition, or characteristic described in connection with the embodiment is included in at least one embodiment of the invention. Thus, the appearances of such phrases in various places throughout this specification are not necessarily referring to the same embodiment of the invention. Furthermore, the particular features, configurations, compositions, or characteristics may be combined in any suitable manner in one or more embodiments.

The above summary of the present disclosure is not intended to describe each disclosed embodiment or every implementation of the present invention. The description that follows more particularly exemplifies illustrative embodiments. In several places throughout the application, guidance is provided through lists of examples, which examples may be used in various combinations. In each instance, the recited list serves only as a representative group and should not be interpreted as an exclusive list.

DETAILED DESCRIPTION OF ILLUSTRATIVE EMBODIMENTS

The present disclosure provides polymeric films and display devices that include these polymeric films. The polymeric film includes a polymeric layer having two major surfaces, wherein the polymeric layer includes a polymeric matrix and particles (preferably, polymeric particles).

This polymeric layer having particles is referred to as the first polymeric layer. The first polymeric layer includes: a first polyolefin-based low WVTR adhesive polymeric matrix having a refractive index $n_1$; and particles having a refractive index $n_2$ uniformly dispersed within the first polymeric matrix; wherein the particles are present in an amount of less than 30 vol-%, based on the volume of the first polymeric layer, and have a particle size range of 400 nanometers (nm) to 3000 nm; and wherein $n_1$ is different than $n_2$. Such a polymeric film has the optical function of a very moderate optical diffuser.

In certain embodiments, the first polymeric layer is the only polymeric layer of the polymeric film of the present disclosure. In certain embodiments, the first polymeric layer is one of two polymeric layers of the polymeric film of the present disclosure. In certain embodiments, the first polymeric layer is one of two or more polymeric layers of the polymeric film of the present disclosure.

Figure 1:
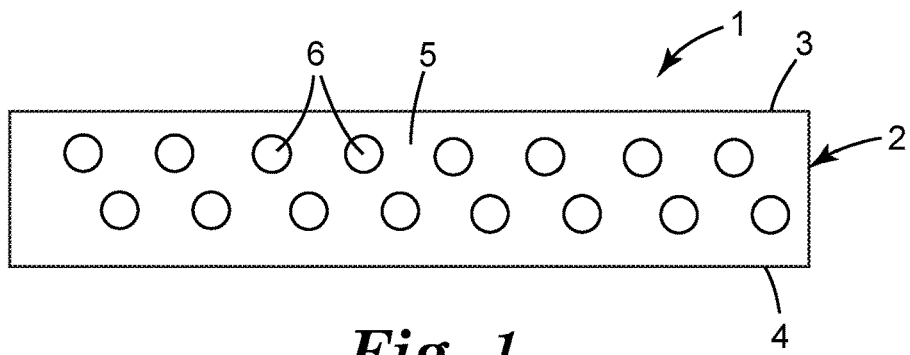
FIG. 1 is a cross-sectional representation of a single-layer polymeric film of the present disclosure.

As shown in FIG. 1, in certain embodiments, polymeric film 1 includes a polymeric layer 2 having two major surfaces 3 and 4, wherein the polymeric layer 2 includes a polymeric matrix 5 including a polyolefin-based low WVTR adhesive, and particles 6 (preferably, polymeric particles) uniformly dispersed within this polymeric matrix 5.

Figure 2:
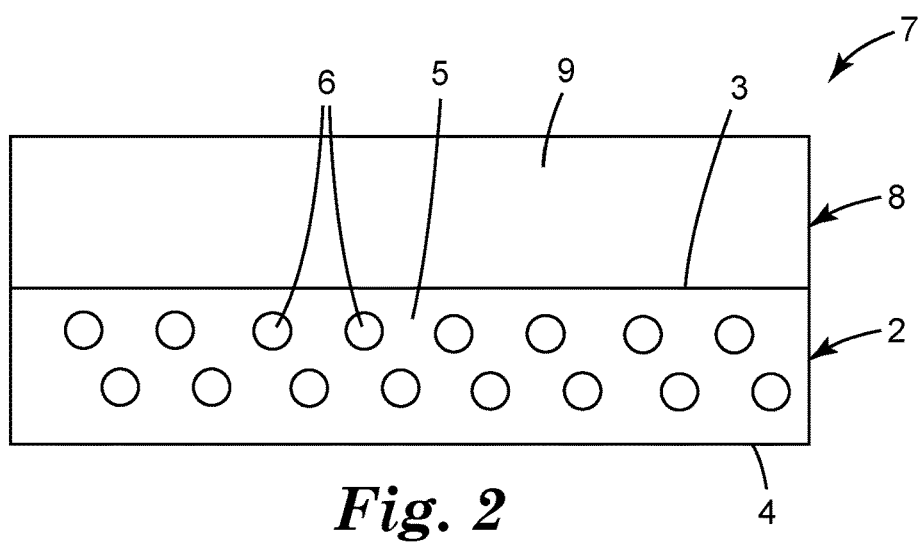
FIG. 2 is a cross-sectional representation of a dual-layer polymeric film of the present disclosure (layers are not to scale).

As shown in FIG. 2, in certain embodiments, polymeric film 7 of the present disclosure includes a second polymeric layer 8 disposed on one major surface 3 of the first polymeric layer 2, which includes polymeric matrix 5 (i.e., first polymeric matrix 5) and particles 6. The second polymeric layer 8 includes a second polymeric matrix 9. The first polymeric matrix 5 and the second polymeric matrix 9 may be the same or different.

The first polymeric matrix (the matrix in which the particles are dispersed) has a refractive index $n_1$, and the second polymeric matrix has a refractive index $n_3$. In certain embodiments, the first polymeric matrix and the second polymeric matrix include the same material. In certain embodiments, the first polymeric matrix is different than the second polymeric matrix.

In certain embodiments, if the first and second polymeric matrices are different, $n_1$ is at least 0.05 unit different than $n_3$. In certain embodiments, $n_1$ is within 0.2 unit of $n_3$, and in certain embodiments, $n_1$ is within 0.1 unit of $n_3$. In this context "within" means within 0.2 unit (or 0.1 unit) higher or lower.

In certain embodiments, the first polymeric matrix and the second polymeric matrix each comprises an adhesive matrix. In certain embodiments, the first adhesive matrix and the second adhesive matrix include the same material. In certain embodiments, the first adhesive matrix is different than the second adhesive matrix.

In certain embodiments, the first (possibly only) polymeric layer of the polymeric film has a thickness of at least 10 micrometers (microns or μm). In certain embodiments, the first (possibly only) polymeric layer of the polymeric film has a thickness of up to 100 microns, or up to 50 microns, or up to 25 microns, or up to 15 microns.

In certain embodiments, the second polymeric layer of the polymeric film has a thickness of at least 25 microns. There is no maximum thickness to this second polymeric layer, although, in certain embodiments, it may be up to 1 millimeter (mm) thick.

In certain embodiments, the overall polymeric film has a thickness of at least 10 microns. In certain embodiments, the overall polymeric film has a thickness of up to 130 microns.

A polymeric film of the present disclosure has the following characteristics: a clarity of at least 80% (preferably at least 85%, or more preferably at least 90%); a visible light transmission of at least 85% (preferably at least 90%); and a bulk haze of 15% to 80% (preferably 20% to 80%, more preferably 30% to 70%, and even more preferably 30% to 50%).

Accordingly, such films can be used in display devices, particularly devices that include an organic light-emitting diode display panel. They can function as very moderate optical diffusers with controlled local uniformity. The clarity, transmission, and bulk haze can be measured using a Haze Gard Plus (from BYK Gardner, Columbia, Md.), which reports measurements from a sampling beam of 18 millimeters (mm) aperture of the polymeric film, as described in the Examples Section.

The polymeric films of the present disclosure can significantly improve the known problem of color variation with viewing angle for OLED displays. This problem is commonly labelled off-angle color shift, or angular color non-uniformity, and the solution to the problem described herein is referred to as Wide View Color (WVC) correction. Thus, the polymeric films of the present disclosure are referred to herein as Wide View Color (WVC) correction films or WVC correction polymeric films.

A WVC correction polymeric film not only significantly improves angular color uniformity, it is compatible with a circular polarizer, maintains brightness and viewing angle, and does not noticeably introduce visual defects, such as commonly known pixel blur or localized scattering anomalies (known as "sparkle"). The pixel blur for said polymeric films is only slightly visible under a microscope, with negligible light blurred into the neighboring pixels, so the visual appearance of the display pixels is essentially maintained.

Significantly, the polymeric films control light diffusion and significantly improve angular color uniformity of OLED displays by controlling the differences in refractive indices between the particles and the polymeric matrix, the size and loading of the particles, the thickness of the polymeric films, and the distance between the first polymeric layer of the polymeric film and display. The larger the distance between the first polymeric layer of the polymeric film and the emissive display plane, the more undesirable pixel blur increases. The smaller the pixel size, the closer the first polymeric layer of the polymeric film and display plane should be. Also, as this distance increases, the contrast ratio becomes undesirably low. Because of these two factors, the distance between the first polymeric layer of the polymeric film and the emissive display plane is desirably minimized. For one example, for commercially available handheld devices having typical pixel spacing of 50 microns, the distance between the first polymeric layer of the polymeric film and the emissive display plane should preferably be less than 150 microns. For an additional example, large display monitors having typical pixel spacing of 500 microns, the distance between the first polymeric layer of the polymeric film and the emissive display plane should preferably be less than 1500 microns. In general, the distance between the first polymeric layer of the polymeric film and the emissive display plane is desirably less than 3 times the pixel spacing dimension of the display. Smaller first polymeric layer to display plane distances are even more preferable. In some embodiments, the distance between the first polymeric layer of the polymeric film and the emissive display plane is desirably less than 2 times the pixel spacing dimension of the display. In other embodiments, the distance between the first polymeric layer of the polymeric film and the emissive display plane is desirably less than the pixel spacing dimension for the display. The polymeric films do not significantly affect major performance characteristics, including brightness, circular polarizer compatibility, and view angle. Also, importantly, the pixel blur can be significantly reduced.

The low WVTR polyolefin-based polymeric layer can be particularly useful as the first adhesive layer outside the thin film encapsulant layer of an OLED panel. Such polymeric layer can be used as a secondary barrier for moisture and oxygen and thus help protect the OLED from environmental exposure and damage. Being positioned just outside the thin film encapsulant layer of the OLED panel also brings the polymeric layer in very close proximity to the pixels, thus reducing pixel blur and contrast ratio loss.

Particles

In the current disclosure, particles, such as polymeric particles, are uniformly dispersed within a polymeric matrix. In this context, "uniformly dispersed" means a continuous randomly dispersed particle distribution throughout a polymeric matrix. Such dispersed particles are dispersed individual particles, not aggregates or aggregations of particles. The presence of such aggregates creates highly localized haze differences that show up in a lit display as a defect known in the industry as sparkle. Unlike typical bulk diffusers that are often positioned on the backside of the display panel, such as an LCD, the current application requires that the optical film be placed between the display panel and the viewer, making defects due to particle aggregation more obvious. In addition, for wide view color applications a high clarity of the optical film is often desired. Such clarity would also make particle agglomerates more apparent, in contrast with typical diffusers which are commonly higher in haze and lower in clarity.

In order to get uniformly dispersed particles in a polymer matrix, mixing processes and coating methods need to be controlled. For example, to effectively disperse particles in a polymer precursor (for example, curable monomers) or a polymer composition, mechanical mixing may be carried out for a period of time on the order of minutes. Alternatively, rolling of samples (dry particles added to polymer precursor or solution) may be carried out, although to get complete and homogenous particle dispersion this may have to be done for extensive periods of time (e.g., on the order of days or weeks). Thus, roller mixing is not very practical or effective, and mechanical mixing is preferred because of its efficiency and high shearing capability, which helps break up any particle agglomerates that may be present during the initial mixing.

In addition to mechanical mixing, controlled (slow) addition of the particles to the components being mechanically mixed is typically necessary to avoid agglomeration of the individual particles. Rapid addition of particles can easily form a "wet-cake-like solid" that is difficult to redisperse once formed. Slow addition can involve adding small volumes (i.e., small shots) of particles so the mixer does not get overwhelmed and a cake is not formed. Once a small shot of particles is mixed in, another shot is added. Once a cake forms, it can be difficult to break it up and get a completely uniform dispersion in a reasonable amount of time. Thus, in certain embodiments, to effectively uniformly disperse particles in a polymer matrix, a high shear mixer (e.g., disperser disk DSFB635, manufactured by Promix, Ontario, Canada) in combination with slow addition of the particles is preferred. Typically, for the more robust polymer or inorganic beads, high shear can be used, while for softer or more fragile particles, lower but longer shear exposure is recommended.

Unlike samples in which the particles are simply dispersed in the monomer syrup and mixed on a roller for 24 hours (following one of the general procedures disclosed in International Publication No. WO 2010/033558), additional mechanical stirring significantly reduces sparkle. In contrast to the methods used in International Publication No. WO 2010/033558 (which typically involved dumping particles in a syrup and mixing on a roller mixer for only a few hours because dispersion uniformity was not necessary for the desired application, e.g., backside diffuser for an LCD), mechanically stirring (i.e., mechanically mixing) can significantly reduce particle aggregations in solution, resulting in a uniform dispersion of particles in a coated polymer matrix. In addition, sufficient mixing time can be used to break up particle aggregations in solution, if it occurs. Furthermore, to avoid particle settling and/or agglomeration, polymer/particle mixtures are continuously mixed, at least on a roller, until they are coated onto a substrate. In-line mixing during the coating process can be advantageously used, provided the shear/mixing time is sufficient to uniformly disperse the particles in the coating composition. In-line mixers such as those available from Quadro (Waterloo, Ontario, Canada) may be useful.

To retain uniformly dispersed particles in the final polymeric film, it is also preferred that a coating composition is coated through a precision coating method, such as slot die coating, where a relatively large gap between the die and carrier film is preferred. Also, the addition of an optical clear adhesive layer that is not optically functional (diffusive) opens more gap between the die and carrier film, as a result, providing uniformly dispersed samples. Coating methods where dispersed particles may hang-up or dry on the coating knife or die may cause issues with particle agglomeration and are generally not preferred.

The particles have a particle size range of 400 nanometers (nm) to 3000 nm, or a particle size range of 700 nm to 2.0 micrometers (microns). In this context, "particle size" refers to the longest dimension of a particle, which is the diameter of a spherical particle. A "particle size range" refers to a distribution of particle sizes from the smallest to the largest (not an average). Thus, the particles are not necessarily uniform in size. The particle size can be determined by scanning electron microscopy (SEM).

The particles may be of a variety of shapes, including polyhedron, parallelepiped, diamond, cylinder, arcuate, arcuate cylinder, rounded (e.g., oval or spherical or equiaxial), hemisphere, gumdrop, bell, cone, frusto conical cone, irregular, and mixtures thereof. In certain embodiments, the particles are spherical beads.

The polymeric film of the present disclosure includes a first polymeric layer having two major surfaces, wherein the first polymeric layer includes a first polymeric matrix and particles (preferably, polymeric particles) uniformly dispersed therein. The particles have a refractive index $n_2$ and the first polymeric matrix in which the particles are dispersed have a refractive index $n_1$, wherein $n_1$ is different than $n_2$. In certain embodiments, $n_1$ is at least 0.01 unit different than $n_2$. In certain embodiments, $n_1$ is at least 0.02 unit, or at least 0.03 unit, or at least 0.04 unit, or at least 0.05 unit different than $n_2$. In certain embodiments, $n_1$ is at most 0.5 unit different than $n_2$. In certain embodiments, $n_1$ is within 0.5 unit of $n_2$, $n_1$ is within 0.4 unit of $n_2$, $n_1$ is within 0.3 unit of $n_2$, $n_1$ is within 0.2 unit of $n_2$, or $n_1$ is within 0.1 unit of $n_2$. In this context "within" means within 0.5 unit (or 0.4 unit, or 0.3 unit, or 0.2 unit, or 0.1 unit) higher or lower.

Particles are preferably organic polymeric particles, but other particles may be used as well. Exemplary non-organic particles include $SiO_2$, $Al_2O_3$, $ZrO_2$, $ZnO$, and mixtures thereof. Exemplary organic polymers for use in the organic particles include an organic polymeric material selected from a silicone, such as a polydimethylsiloxane (PDMS), a polyurethane, a polymethyl methacrylate (PMMA), a polystyrene, or a combination thereof.

In certain embodiments, the particles are present in the first polymeric layer in an amount of less than 30 percent by volume (vol-%), based on the volume of the first polymeric layer. In certain embodiments, the particles are present in the first polymeric matrix in an amount of up to 25 vol-%, up to 20 vol-%, or up to 15 vol-%, based on the total volume of the first polymeric layer. In certain embodiments, the particles are present in the first polymeric matrix in an amount of at least 0.5 vol-% (or at least 1 vol-%), based on the total volume of the first polymeric layer.

Polymeric Matrices

Polymeric matrices of the polymeric films of the present disclosure include a polyolefin-based adhesive with low water vapor transmission rate (WVTR). In particular, the polymeric layer having optically diffusing properties (layer 2 in FIG. 1 and FIG. 2) includes such polyolefin-based adhesive with low water vapor transmission rate. In this context, "low WVTR" refers to polymers having a bulk water vapor transmission rate of less than 100 grams/m$^2$ per day, preferable less than 80 grams/m$^2$ per day, when measured using modified test method JIS Z0208 using Drierite (available from W.A. Hammond Drierite Co., Ltd, Xenia Ohio) as the desiccant and a 65° C. and 90% relative humidity environmental exposure.

In certain embodiments, such adhesive has low moisture content, low dielectric constant (Dk), and optional UV blocking features. In this context, "low moisture content" refers to a water content of less than 1% on solids as determined by Karl-Fisher titration. In this context, "low dielectric constant" refers to a dielectric constant of less the 2.5 when measured at a frequency of 100 kHz.

In one embodiment, the polyolefin-based adhesive is an optically clear adhesive (OCA).

Examples of suitable low WVTR polyolefin-based adhesives (i.e., adhesive compositions) are described, for example, in U.S. Pat. App. Pub. Nos. US 2012/0285618 (Bharti et al.), US 2012/0128966 (Ma et al.), US 2005/0147813 (Gotz et al.), and U.S. Pat. No. 8,232,350 (Fujita et al.).

Preferred polyolefin-based adhesives include polyisobutylene (PIB) resins. Examples of suitable PIB resins for use in the adhesive or OCA materials described herein, are generally resins having a polyisobutylene skeleton in the main or a side chain. Fundamentally, such a polyisobutylene resin can be prepared by polymerizing isobutylene alone or as a combination of isobutylene and n-butene, isoprene, or butadiene in the presence of a Lewis Acid catalyst such as aluminum chloride or boron trifluoride. Suitable polyisobutylene resins are commercially available under the trade designation VISTANEX (Exxon Chemical Co.), HYCAR (Goodrich Corp.), OPPANOL (BASF AG), and JSR BUTYL (Japan Butyl Co., Ltd.).

In certain embodiments, an adhesive composition includes: one or more low molecular weight polyisobutylene polymer(s), one or more high molecular weight polyisobutylene polymer(s) and optionally, a tackifier.

In other embodiments, a medium or high molecular weight polyisobutylene, and optional tackifier is used.

In a further embodiment, the low molecular weight polyisobutylene polymer has a weight average molecular weight of 75,000 or lower, and the high molecular weight polyisobutylene polymer has a weight average molecular weight of 120,000 or higher.

In an embodiment, the adhesive or OCA polymeric matrix includes polyisobutylene (PIB) as the base polymer wherein the PIB is a combination of one or more PIB resin(s) having a combined a weight average molecular weight of 75,000 and below (hereafter "low-molecular weight PIB resin"), and a combination of one or more PIB resin(s) having a combined a weight average molecular weight of 120,000 and above (hereafter "high-molecular weight PIB resin").

The low-molecular weight PIB resin has a weight average molecular weight 75,000 g/mol or below. The high-molecular weight PIB resin has a weight average molecular weight 120,000 g/mol or above. Applicants have found that the combination of the low and high-molecular weight PIB resins is particularly advantageous as the combination provides a broad range of desirable characteristics. Low molecular weight PIB facilitates processing during hot melt extruding, by lowering the melt viscosity of the compounded adhesive mixture. In solvent processing, low molecular weight facilitates faster diffusion of solvent during drying, thus enabling thicker coatings. Also, low molecular weight PIB imparts conformability to an OCA which enables ink step coverage, and proper wet-out on different surfaces. High molecular weight imparts cohesion to an adhesive system which improves the adhesive forces, shear strength, tensile strength, and room temperature and high temperature dimensional stability. Differing applications may require broad range of composition to accommodate the particular characteristic for each particular application. The amount of low-molecular weight PIB present in the adhesive or OCA can be 1-90% by weight and the amount of high-molecular weight PIB present in the adhesive or OCA can be 1-80% by weight. More than one low molecular weight PIB and more than one high molecular weight can be used.

The adhesive or OCA polymer matrix disclosed herein may optionally include a tackifier when the polyolefin elastomer is not sufficiently tacky to function as an adhesive. Addition of tackifiers allows the composition to have higher adhesion which can be beneficial for some applications where adhering to different substrates is a critical requirement. The addition of tackifiers increases the Tg of the composition and can reduce its storage modulus at room temperature, thus making it less elastic and more flowable, such as what is required for compliance to an ink step during lamination. However, that same addition of a tackifier can shift the visco-elastic balance too much towards the viscous behavior, such as in those cases where minimal creep and thus less flow is required. The addition of tackifiers is thus optional, and its presence and concentration is dependent on the particular application.

Suitable tackifiers include non-hydrogenated and hydrogenated aliphatic tackifiers, including so-called C5 resins and dicyclopentadienyl resins. Hydrogenated resins are preferred. These tackifiers are typically used between 1 and 70 parts per hundred by weight based on the polymer components. Because of their low color and environmental stability, these tackifiers are particularly advantageous for OCA type applications. In some embodiments, tackifiers are used between 10 and 60 parts per hundred by weight based on the polymer components.

Other suitable tackifiers include, organic resins, such as wood-based resins such as a rosin resin, a rosin phenol resin, and a rosin ester resin; hydrogenated rosin-based resins obtained by hydrogenating these rosin-based resins; terpene based resins including a terpene phenol-based resins, and an aromatic modified terpene-based resin; and hydrogenated terpene-based resins obtained by hydrogenating these terpene based resins; and resins derived from petroleum, such as C9-based petroleum resins and their hydrogenated versions (cycloaliphatics), or mixed synthetic resins such as those obtained by copolymerizing C9 fractions and C5 fractions of petroleum resins and their hydrogenated versions. These tackifiers may be less miscible and colored, so they are used where slight haze is acceptable and at lower concentrations so the OCA color is acceptable.

In addition, liquid rheology modifiers, such as plasticizers or oils may also be used. For example mineral oil (Kaydol), napthenic oil (Calsol 5550), paraffinic (Hyprene P100N) etc. The benefit of using a plasticizer/oil in combination with a tackifier is that it allows one to reduce the glass transition temperature of the composition in addition to reducing the storage modulus of the composition. This imparts higher flow characteristics to the composition, which is advantageous in applications where conformability to features like ink steps, flex connects etc., is required.

The adhesive or OCA polymeric matrix disclosed herein may further include a UV blocking agent. The UV blocking package includes UV absorbers or combination of UV absorbers and light stabilizers. Examples of suitable UV absorbers include, but are not limited to, benzophenone, benzotriazole, triazines or combination of them. Examples of light stabilizers include, but are not limited to, hindered amine light stabilizers (HALS).

The adhesive or OCA polymeric matrix disclosed herein may further include additional additives such as primary and secondary antioxidants, in-process stabilizers, light stabilizers, processing aids, and elastomeric polymers, nanoscale fillers, transparent fillers, getter/scavenger fillers, desiccants, crosslinkers, pigments, extenders, softeners, and resin stabilizers. These additives may be used singly and in combination of two or more kinds thereof.

For dual layer embodiments (see, e.g., FIG. 2), the polymeric layers may be the same material or they may be composed of two different materials. In either case, each polymeric layer may include a low WVTR polymer matrix.

In certain embodiments, a dual layer product construction (see, e.g., FIG. 2) may include one layer (layer 2 in FIG. 2) having particular optically diffusing properties and a second layer (layer 8 in FIG. 2) being an optically clear adhesive. Some of the benefits for forming a dual layer product construction would be to provide improved adhesive properties such as peel strength, robustness, coating integrity, etc. In cases where the dual layer product is incorporated into an OLED display device, the optically diffuse layer (layer 2 of the two layer system in FIG. 2) is preferably facing an OLED emissive display plane (e.g., the active-matrix organic light-emitting diode panel 10 in FIG. 3) and placed as close to that plane as the construction allows. For best performance, including contrast ratio and minimization of pixel blur, etc., the optically diffuse layer would be preferably in direct contact with an OLED encapsulation layer(s) (e.g., a combination of a barrier film 14 and a first adhesive film 12 in FIG. 3). If not in direct contact, the performance may be degraded as the distance between the diffuse layer and emissive plane increases.

In certain embodiments, the second polymeric matrix includes an acrylate, a polyurethane, a polyolefin (such as a polyisobutylene (PIB)), a silicone, or a combination thereof. In certain embodiments, the second polymeric matrix comprises a polyolefin, such as polyisobutylene. Thus, in certain embodiments, the polymeric matrix of the first polymeric layer (i.e., first polymeric matrix) and the polymeric matrix of the second polymeric layer (i.e., second polymeric matrix) may include the same polymers.

In certain embodiments the second polymeric matrix includes a tackified polyolefin elastomer, such as a rubber-based block copolymer (for example, polystyrene/polybutadiene/polystyrene or polystyrene/polyisoprene/polystyrene block copolymers and hydrogenated versions thereof), an olefin block copolymer (such as those available under the trade name INFUSE available from Dow Elastomers, Midland, Mich.), or an alpha-olefin copolymer.

In certain embodiments, the second polymeric matrix includes an optically clear adhesive (OCA). In certain embodiments, the optically clear adhesive is selected from an acrylate, a polyurethane, a polyolefin (such as a polyisobutylene (PIB)), a silicone, or a combination thereof. Illustrative OCAs include those described in International Pub. No. WO 2008/128073 (3M Innovative Property Co.) relating to antistatic optically clear pressure sensitive adhesives, U.S. Pat. App. Pub. Nos. US 2009/089137 (Sherman et al.) relating to stretch releasing OCA, US 2009/0087629 (Everaerts et al.) relating to indium tin oxide compatible OCA, US 2010/0028564 (Cheng et al.) relating to antistatic optical constructions having optically transmissive adhesive, US 2010/0040842 (Everaerts et al.) relating to adhesives compatible with corrosion sensitive layers, US 2011/0126968 (Dolezal et al.) relating to optically clear stretch release adhesive tape, and U.S. Pat. No. 8,557,378 (Yamanaka et al.) relating to stretch release adhesive tapes. Suitable OCAs include acrylic optically clear pressure sensitive adhesives such as, for example, 3M OCA 8146 available from 3M Company, St. Paul, Minn.

Display Devices

In certain embodiments, display devices of the present disclosure include: an organic light emitting diode panel having a multi-layer construction including one or more adhesive films; and a polymeric film as described herein incorporated within the multi-layer construction of the organic light emitting diode panel. In this context, in certain embodiments, "incorporated within the multi-layer construction" means that the polymeric film of the present disclosure replaces one or more adhesive films (e.g., optically clear adhesive films) of the multi-layer construction, particularly if the polymeric film includes an adhesive matrix. In this context, in certain embodiments, "incorporated within the multi-layer construction" means that the polymeric film of the present disclosure is incorporated into one or more adhesive films (e.g., optically clear adhesive films) of the multi-layer construction, particularly if the polymeric film itself does not include an adhesive matrix.

The polymeric film includes a first polymeric layer having two major surfaces, wherein the first polymeric layer includes: a first polymeric matrix having a refractive index $n_1$; and particles having a refractive index $n_2$ uniformly dispersed within the first polymeric matrix. The particles are present in an amount of less than 30 vol-%, based on the volume of the first polymeric layer, and have a particle size range of 400 nm to 3000 nm.

In such embodiments, $n_1$ is different than $n_2$. In some embodiments, $n_1$ is at least 0.01 unit different than $n_2$. In some embodiments, $n_1$ is at least 0.02 unit, or at least 0.03 unit, or at least 0.04 unit, or at least 0.05 unit different than $n_2$. In some embodiments, $n_1$ is at most 0.5 unit different than $n_2$. In some embodiments, $n_1$ is within 0.5 unit of $n_2$, $n_1$ is within 0.4 unit of $n_2$, $n_1$ is within 0.3 unit of $n_2$, $n_1$ is within 0.2 unit of $n_2$, or $n_1$ is within 0.1 unit of $n_2$. In this context "within" means within 0.5 unit (or 0.4 unit, or 0.3 unit, or 0.2 unit, or 0.1 unit) higher or lower.

Significantly, in certain embodiments, a display device that includes a polymeric film of the present disclosure has an off-axis color shift (0-45°) that is at least 5% better (or at least 10% better, or at least 20% better, or at least 30% better) than an off-axis color shift compared to a display device that includes a non-diffusive optically clear adhesive in place of the polymeric film. In certain embodiments, a display device that includes a polymeric film of the present disclosure has an off-axis color shift (0-60°) that is at least 5% better (or at least 10% better, or at least 20% better, or at least 30% better) than an off-axis color shift compared to a display device that includes a non-diffusive optically clear adhesive in place of the polymeric film. In this context, a "non-diffusive" optically clear adhesive refers to an adhesive that is free of any light scattering particles or domains. Such an adhesive typically has a bulk haze of less than 0.5%.

Display devices of the present disclosure may be flexible or rigid. Examples of OLED displays that could incorporate the polymeric films of the present disclosure are described in U.S. Pat. App. Nos. US 2016/0001521 (Tanaka et al.), US 2014/0299844 (You et al.), and US 2016/0155967 (Lee et al.).

Figure 3:
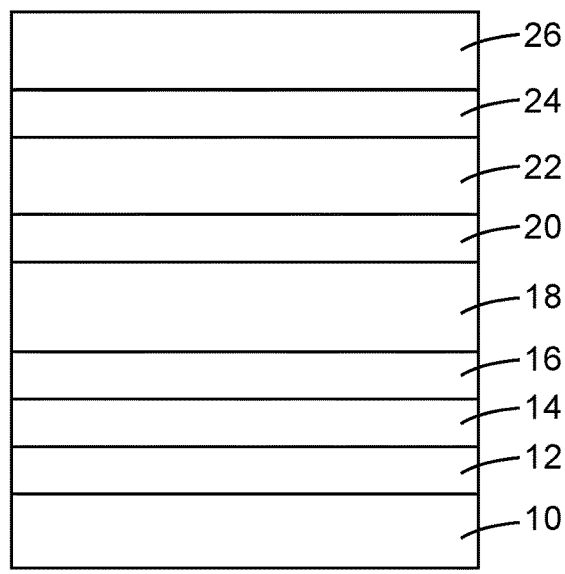
FIG. 3 is a cross-sectional representation of an organic light emitting diode panel having a multi-layered construction (layers are not to scale).

Exemplary devices include an organic light emitting diode panel having a multi-layered construction that includes, as shown in FIG. 3, an active-matrix organic light-emitting diode (AMOLED) panel 10; a first adhesive film 12 disposed on the active-matrix organic light-emitting diode panel 10; a barrier film 14 disposed on the first adhesive film 12; a second adhesive film 16 disposed on the barrier film 14; a circular polarizer 18 disposed on the second adhesive film 16; a third adhesive film 20 disposed on the circular polarizer 18; a touch panel 22 disposed on the third adhesive film 20; a fourth adhesive film 24 disposed on the touch panel 22; and a cover window 26 disposed on the fourth adhesive film 24. In certain embodiments, first adhesive film 12 includes an adhesive with good barrier properties like polyisobutylene. In certain embodiments, barrier film 14 is a conventional inorganic/organic multi-layer barrier film.

The display device of FIG. 3 is exemplary only of various multi-layered constructions. In certain embodiments, for example, barrier film 14 is incorporated into the AMOLED panel 10. In certain embodiments, first adhesive film 12 and barrier film 14 combined form a barrier against moisture and oxygen. In certain embodiments, touch panel 22 is incorporated into the AMOLED panel 10.

In certain multi-layer constructions, a polymeric film of the present disclosure includes at least one adhesive matrix. In such embodiments, such polymeric film can be the first adhesive film 12 (FIG. 3).

In certain embodiments, the second, third, and/or fourth adhesive films (16, 20, 24 of FIG. 3) include (or is replaced by) a polymeric film of the present disclosure. In certain embodiments, the third and/or fourth adhesive films (20, 24 of FIG. 3) include (or is replaced by) a polymeric film of the present disclosure.

The adhesive films of the multi-layer construction shown in FIG. 3 that do not include a polymeric film include an optically clear adhesive as described above. In certain embodiments, first adhesive film 12 would typically have some barrier properties against moisture and oxygen.

Figure 4:
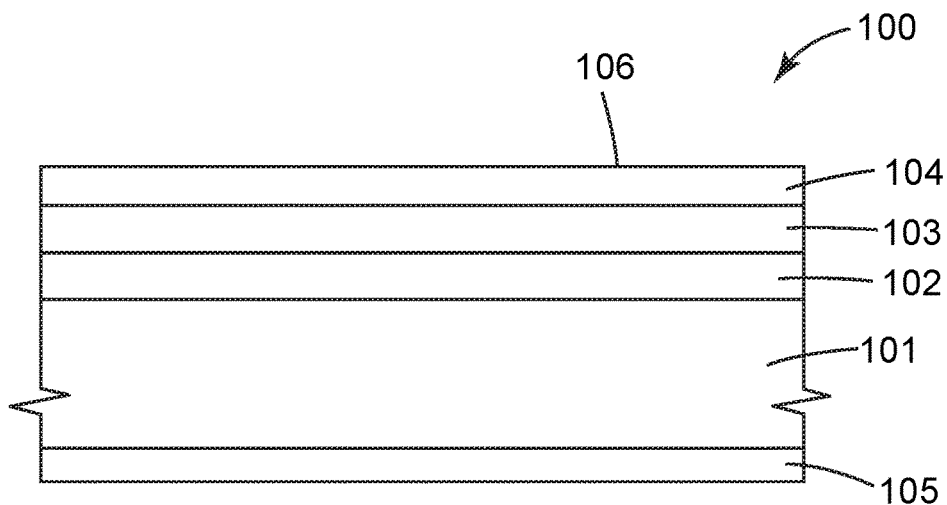
FIG. 4 is a cross-sectional representation of an exemplary active-matrix organic light-emitting diode panel (AMOLED panel).

In certain embodiments, the active-matrix organic light-emitting diode panel (10 of FIG. 3) includes an organic electroluminescent layer. For example, an exemplary active-matrix organic light-emitting diode panel (AMOLED panel) is shown in FIG. 4, and includes a driving substrate 101 in which a driving device array (e.g., a thin-film transistor (TFT) array) is arranged, an organic electroluminescent layer 102, a cathode electrode layer 103, and an encapsulation layer 104. A color filter layer (not shown) may be further arranged between the organic electroluminescent layer 102 and the encapsulation layer 104. A reflective layer 105 for reflecting light toward the encapsulation layer 104, that is, toward a light-emitting surface 106, may be provided under the driving substrate 101. Because the AMOLED panel is a self-emissive display panel in which the organic electroluminescent layer 102 generates light by using a driving signal, a separate light source (e.g., a backlight) may not be necessary.

In certain embodiments, a barrier film (14 of FIG. 3) includes an optical substrate such as COP (cyclic olefin polymer) or PET (polyethylene terephthalate) deposited with alternating layers of organic/inorganic materials that form an oxygen and moisture barrier. Examples of inorganic materials include silica, alumina, silicon carbide, and silicon nitride. An example includes a cured tricyclodecane dimethanol diacrylate and silica alternating layers). The organic layers are typically highly crosslinked acrylic materials.

Figure 5:
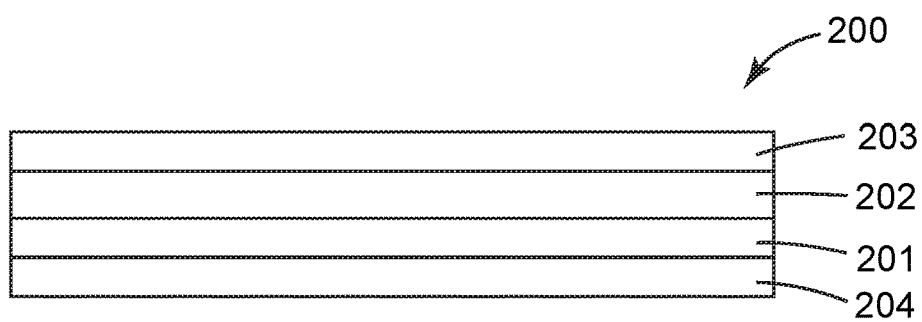
FIG. 5 is a cross-sectional representation of a circular polarizer according to an exemplary embodiment of the present disclosure.

An exemplary circular polarizer (18 of FIG. 3) is shown in FIG. 5, which is a cross-sectional view of the circular polarizer 200 according to an exemplary embodiment. Referring to FIG. 3, the circular polarizer 200 may include a linear polarizer 202, an upper support plate 203 and a lower support plate 201 that support the linear polarizer 202, and a quarter (λ/4) phase plate 204. The linear polarizer 202 may be, for example, a polyvinyl alcohol (PVA) film. The upper support plate 203 and the lower support plate 201 may be, for example, tri-acetyl-cellulose (TAC) films. The λ/4 phase plate 204 may be adhered to the lower support plate 201 by using an OCA layer. Exemplary embodiments are not limited to these types. The linear polarizer 202 linearly polarizes the external light L1. The λ/4 phase plate 204 circularly polarizes linearly polarized light and linearly polarizes circularly polarized light.

Figure 6:
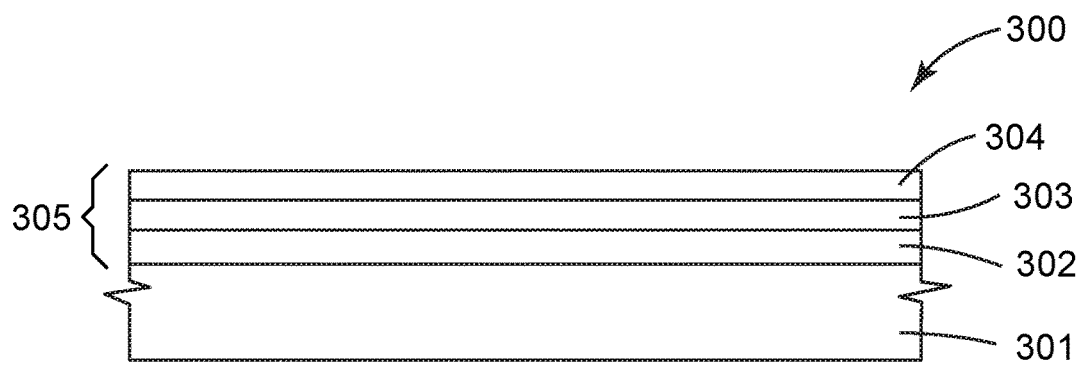
FIG. 6 is a cross-sectional representation of a capacitive touch panel according to an exemplary embodiment of the present disclosure.

In certain embodiments, a touch panel (22 of FIG. 3) includes a base substrate configured to transmit light and a touch electrode layer configured to receive a touch input. For example, FIG. 6 is a cross-sectional view of the touch panel 300 that is a capacitive touch panel according to an exemplary embodiment. The touch panel 300 is a manipulation unit that receives a user input. Resistive touch panels or capacitive touch panels are used in mobile devices. Referring to FIG. 6, the touch panel 300 may include a base substrate 301 that is a light-transmitting base substrate and a touch electrode layer 305 that is a light-transmitting touch electrode layer. The touch electrode layer 305 may include first and second electrode layers 302 and 304, and a dielectric layer 303 that is disposed between the first and second electrode layers 302 and 304.

The first electrode layer 302 may be formed by forming as a patterned thin film a conductive metal such as indium tin oxide (ITO), copper metal mesh, or silver nanowires on the base substrate 301 by using vacuum deposition, sputtering, or plating, etc. The dielectric layer 303 may be formed on the first electrode layer 302, and the second electrode layer 304 may be formed by forming as a patterned thin film a conductive metal on the dielectric layer 303 by using vacuum deposition, sputtering, or plating, etc. For example, the first electrode layer 302 may include a plurality of horizontal electrodes, and the second electrode layer 304 may include a plurality of vertical electrodes. Touch cells are formed at intersections between the horizontal electrodes and the vertical electrodes. The horizontal electrodes may be, for example, driving electrodes, and the vertical electrodes may be, for example, receiving electrodes. When a touching object, for example, a user's hand or a touch pen (e.g., stylus) approaches or contacts the touch panel 300, a change in a capacitance of a touch cell occurs. When a touch event occurs, a position of the touch cell may be detected by detecting the change in the capacitance. Also, the touch panel 300 may be formed so that the first and second electrode layers 302 and 304 are formed on a top surface and a bottom surface of the base substrate 301, respectively. Also, the touch panel 300 may be formed so that two substrates on which electrode layers are formed are bonded to each other. The touch panel 300 may be manufactured as a pliable light-transmitting film.

In certain embodiments, a cover window (26 of FIG. 3) includes a curved portion and/or a flat portion. The cover window may be made of a material selected from glass or an optically clear plastic. The cover window may allow an image that is displayed on the OLED panel to be seen therethrough, and may protect the OLED panel from external shock. Thus, the cover window is made of one or more transparent materials. The cover window may be formed of a rigid material, e.g., glass or plastics such as a polycarbonate or a polymethylmethacrylate. The cover window may be formed of a flexible material, e.g., plastics such as a polycarbonate or a polymethylmethacrylate.

EXEMPLARY EMBODIMENTS

Embodiment 1 is a polymeric film comprising: a first polymeric layer having two major surfaces, wherein the first polymeric layer comprises: a first a polyolefin-based low WVTR adhesive polymeric matrix having a refractive index $n_1$; and particles (preferably, polymeric particles) having a refractive index $n_2$ uniformly dispersed within the first polymeric matrix; wherein the particles are present in an amount of less than 30 vol-%, based on the volume of the first polymeric layer, and have a particle size range of 400 nm to 3000 nm; and wherein $n_1$ is different than $n_2$ (in certain embodiments, $n_1$ is within 0.5 unit of $n_2$, $n_1$ is within 0.4 unit of $n_2$, $n_1$ is within 0.3 unit of $n_2$, $n_1$ is within 0.2 unit of $n_2$, or $n_1$ is within 0.1 unit of $n_2$); wherein the polymeric film has: a clarity of at least 80%; a visible light transmission of at least 85%; and a bulk haze of 15% to 80% (preferably 20% to 80%, more preferably 30% to 70%, and even more preferably 30% to 50%).

Embodiment 2 is the polymeric film of embodiment 1 further comprising a second polymeric layer disposed on one major surface of the first polymeric layer; wherein the second polymeric layer comprises a second polymeric matrix having a refractive index $n_3$; wherein the first polymeric matrix and the second polymeric matrix are the same or different.

Embodiment 3 is the polymeric film of embodiment 2 wherein the second polymeric matrix comprises an adhesive matrix.

Embodiment 4 is the polymeric film of embodiment 3 wherein the first adhesive matrix and the second adhesive matrix comprise the same material.

Embodiment 5 is the polymeric film of embodiment 3 wherein the first adhesive matrix is different than the second adhesive matrix.

Embodiment 6 is the polymeric film of embodiment 2, 3, or 5 wherein $n_1$ is different than $n_3$ (preferably at least 0.05 unit different) and within 0.2 unit of $n_3$.

Embodiment 7 is the polymeric film of embodiment 6 wherein $n_1$ is within 0.1 unit of $n_3$.

Embodiment 8 is the polymeric film of any of embodiments 1 to 7 wherein $n_1$ is different than $n_2$ (in certain embodiments, $n_1$ is at least 0.01 unit different than $n_2$, and in certain embodiments, at least 0.02 unit, or at least 0.03 unit, or at least 0.04 unit, or at least 0.05 unit different) and within 0.5 unit of $n_2$.

Embodiment 9 is the polymeric film of embodiment 8 wherein $n_1$ is within 0.2 unit of $n_2$.

Embodiment 10 is the polymeric film of any of embodiments 1 to 9 wherein the particles have a particle size range of 700 nm to 2.0 microns.

Embodiment 11 is the polymeric film of any of embodiments 1 to 10 wherein the particles are present in the first polymeric matrix in an amount of at least 0.5 vol-%, based on the total volume of the first polymeric layer.

Embodiment 12 is the polymeric film of any of embodiments 1 to 11 wherein the particles are present in the first polymeric matrix in an amount of up to 25 vol-%, based on the total volume of the first polymeric layer.

Embodiment 13 is the polymeric film of embodiment 12 wherein the particles are present in the first polymeric matrix in an amount of up to 20 vol-%, based on the total volume of the first polymeric layer.

Embodiment 14 is the polymeric film of embodiment 13 wherein the particles are present in the first polymeric matrix in an amount of up to 15 vol-%, based on the total volume of the first polymeric layer.

Embodiment 15 is the polymeric film of any of embodiments 1 to 14 wherein the first polymeric layer has a thickness of at least 10 microns.

Embodiment 16 is the polymeric film of any of embodiments 1 to 15 wherein the first polymeric layer has a thickness of up to 100 microns.

Embodiment 17 is the polymeric film of embodiment 16 wherein the first polymeric layer has a thickness of up to 25 microns.

Embodiment 18 is the polymeric film of embodiment 17 wherein the first polymeric layer has a thickness of up to 15 microns.

Embodiment 19 is the polymeric film of any of embodiments 2 to 18 wherein the second polymeric layer has a thickness of at least 25 microns.

Embodiment 20 is the polymeric film of any of embodiments 1 to 19 wherein the polymeric film has a thickness of at least 10 microns.

Embodiment 21 is the polymeric film of any of embodiments 1 to 20 wherein the polymeric film has a thickness of up to 130 microns.

Embodiment 22 is the polymeric film of any of embodiments 1 to 21 wherein at least one adhesive matrix comprises an optically clear adhesive.

Embodiment 23 is the polymeric film of any of embodiments 1 to 22 wherein the particles comprise an organic polymeric material selected from a polydimethylsiloxane (PDMS), a polyurethane, a polymethyl methacrylate (PMMA), a polystyrene, or a combination thereof.

Embodiment 24 is the polymeric film of any of embodiments 2 to 23 wherein the second polymeric matrix comprises an acrylate, a polyurethane, a polyolefin (such as a polyisobutylene (PIB)), a silicone, or a combination thereof.

Embodiment 25 is the polymeric film of embodiment 24 wherein the second polymeric matrix comprises a tackified polyolefin elastomer, an olefin block copolymer, or an alpha-olefin copolymers.

Embodiment 26 is the polymeric film of embodiment 25 wherein the second polymeric matrix comprises polyisobutylene.

Embodiment 27 is the polymeric film of any of embodiments 1 to 26 wherein the first polymeric matrix comprises polyisobutylene.

Embodiment 28 is a display device comprising: an organic light emitting diode panel having a multi-layer construction comprising one or more adhesive films; and a polymeric film of any of embodiments 1 to 27 incorporated within the multi-layer construction of the organic light emitting diode panel.

Embodiment 29 is the display device of embodiment 28 (that includes a polymeric film of the present disclosure) having an off-axis color shift (0-45°) that is at least 5% better (or at least 10% better, or at least 20% better, or at least 30% better) than an off-axis color shift compared to a display device that includes a non-diffusive optically clear adhesive in place of the polymeric film.

Embodiment 30 is the display device embodiment 28 or 29 (that includes a polymeric film of the present disclosure) having an off-axis color shift (0-60°) that is at least 5% better (in certain embodiments, at least 10% better, at least 20% better, or at least 30% better) than an off-axis color shift compared to a display device that includes a non-diffusive optically clear adhesive in place of the polymeric film.

Embodiment 31 is the display device of any of embodiments 28 to 30 which is flexible or rigid.

Embodiment 32 is the display device of any of embodiments 28 to 31 wherein the organic light emitting diode panel comprises a multi-layered construction comprising: an active-matrix organic light-emitting diode panel; a first adhesive film disposed on the active-matrix organic light-emitting diode panel; a barrier film disposed on the first adhesive film; a second adhesive film disposed on the barrier film; a circular polarizer disposed on the second adhesive film; a third adhesive film disposed on the circular polarizer; a touch panel disposed on the third adhesive film; a fourth adhesive film disposed on the touch panel; and a cover window disposed on the fourth adhesive film; wherein at least one of the adhesive films comprises the polymeric film.

Embodiment 33 is the display device of embodiment 32 wherein the first, second, third, and/or fourth adhesive films comprises the polymeric film.

Embodiment 34 is the display device of embodiment 32 or 33 wherein the adhesive film that does not include the polymeric film comprises an optically clear adhesive.

Embodiment 35 is the display device of any of embodiments 32 to 34 wherein the active-matrix organic light-emitting diode panel comprises an organic electroluminescent layer.

Embodiment 36 is the display device of any of embodiments 32 to 35 wherein the barrier film comprises an optical substrate such as COP (cyclic olefin polymer) or PET (polyethylene terephthalate) deposited with alternating layers of organic/inorganic materials that forms an oxygen and moisture barrier.

Embodiment 37 is the display device of any of embodiments 32 to 36 wherein the polymeric film is compatible with the circular polarizer.

Embodiment 38 is the display device of any of embodiments 32 to 37 wherein the touch panel comprises a base substrate configured to transmit light and a touch electrode layer configured to receive a touch input.

Embodiment 39 is the display device of any of embodiments 32 to 38 wherein the cover window comprises a curved portion and/or a flat portion.

EXAMPLES

Objects and advantages of this invention are further illustrated by the following examples, but the particular materials and amounts thereof recited in these examples, as well as other conditions and details, should not be construed to unduly limit this invention. These examples are merely for illustrative purposes only and are not meant to be limiting on the scope of the appended claims.

Materials

| Designation | Description | Source |
|---|---|---|
| RF02N | Silicone coated polyester release liner | SKC Haas (Cheonan, Korea) |
| RF22N | Silicone coater polyester release liner | SKC Haas (Cheonan, Korea) |
| TOSPEARL 120A | Silicone beads (2.0 microns, monodispersed) | Momentive Performance Materials, Waterford, NY |
| OPPANOL B10 | Medium molecular weight polyisobutylene | BASF, Florham Park, NJ |

Test Methods

Optical Property Test Methods: Bulk Haze, Transmission, Clarity and Refractive Index Basic optical properties including transmission, bulk haze, and clarity values were measured using a Haze-Guard Plus haze meter (commercially available from BYK-Gardner, Columbia, Md.). Refractive indices of these films were measured using a Metricon Model 2010 Prism Coupler (available from Metricon Corp., Pennington, N.J.). This instrument samples the optical film with rather large area beam (18 millimeter (mm) diameter) to average over considerable area of display surface.

OLED Color Shift Test Method

Figure 7:
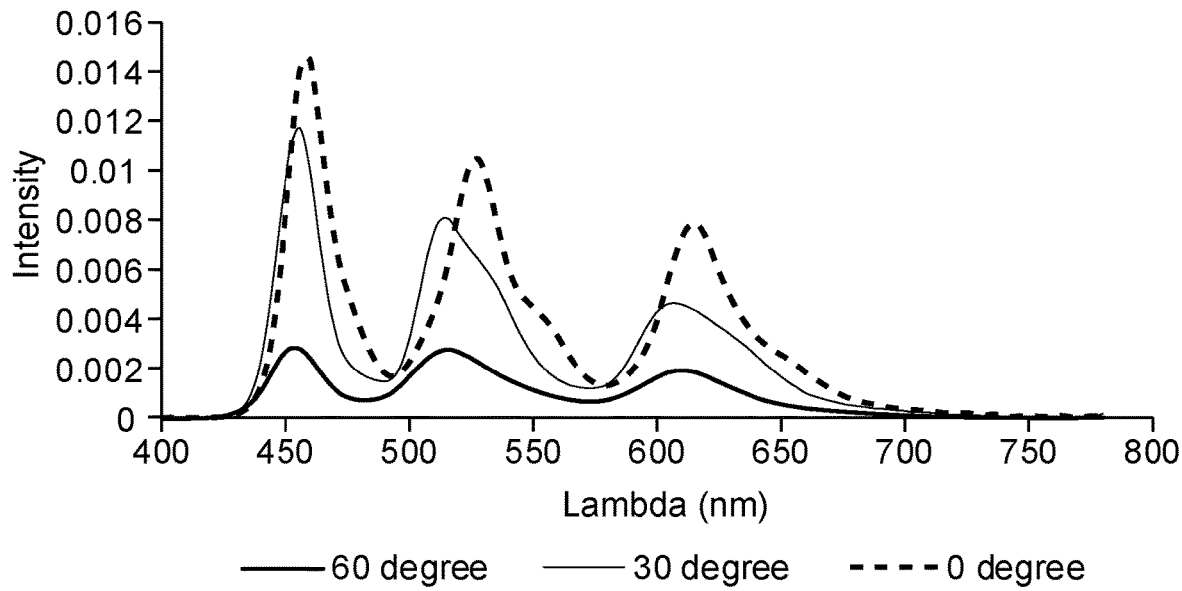
FIG. 7 is an optical spectrum of an exemplary film of the present disclosure for 3 different viewing angles.

The angular color of a strong-cavity OLED device, commonly used in mobile phones, has a blue shift as the viewing angle increases. This effect is commonly referred to as off-angle color shift or angular color non-uniformity. The optical spectrum at three (3) selected viewing angles of a Samsung S5 mobile phone is illustrated in FIG. 7. The spectrum shows three (3) spectral peaks. Although the overall spectrum demonstrates a clear trend of shifting to shorter wavelength as the viewing angle increases, many other spectral parameters also vary—the spectral weights of the three distinct peaks change and the relative shift of each spectral peaks are different from each other.

As a figure of merit for the off-angle color shift, it is common to represent the color shift from the corresponding shift in CIE (Commission on Illumination) color coordinates. The CIE color coordinates (u,v) are measures for differing angles and the metric for color shift can be represented by delta_u'v' as expressed in equation A.

$$\text{delta}\_u'v' = \{[u'(\theta) - u'(\theta)]^2 + [v'(\theta) - v'(\theta)]^2\}^{0.5}; \quad (A)$$

The sample measurement method for OLED color shift utilized a Samsung S5 OLED mobile phone; the same Samsung S5 was used as the testbed for each of the diffuse adhesive samples in the comparison. One intended use of the moderately diffusing polymeric film is to incorporate into the OLED layers, preferably directly above the OLED pixels or above the TFE layer (thin film encapsulation). For this test, however, it is considered equivalent to measure color shifts and brightness with the polymeric film samples placed proximate but outside of the OLED device assembly. More specifically, samples were placed immediately above the touch panel display.

After mounting the samples onto the OLED device assembly, a blank white image was then displayed on the OLED screen. Next, the OLED panel assembly was mounted on a rotation stage to enable angular adjustment relative to the measuring spectrophotometer. For this test system, a PR650 spectrophotometer (PhotoResearch Inc., Syracuse, N.Y.) was used to measure the color and luminance intensity of the testing assembly at every 5 degree incremental rotation angle.

Figure 8:
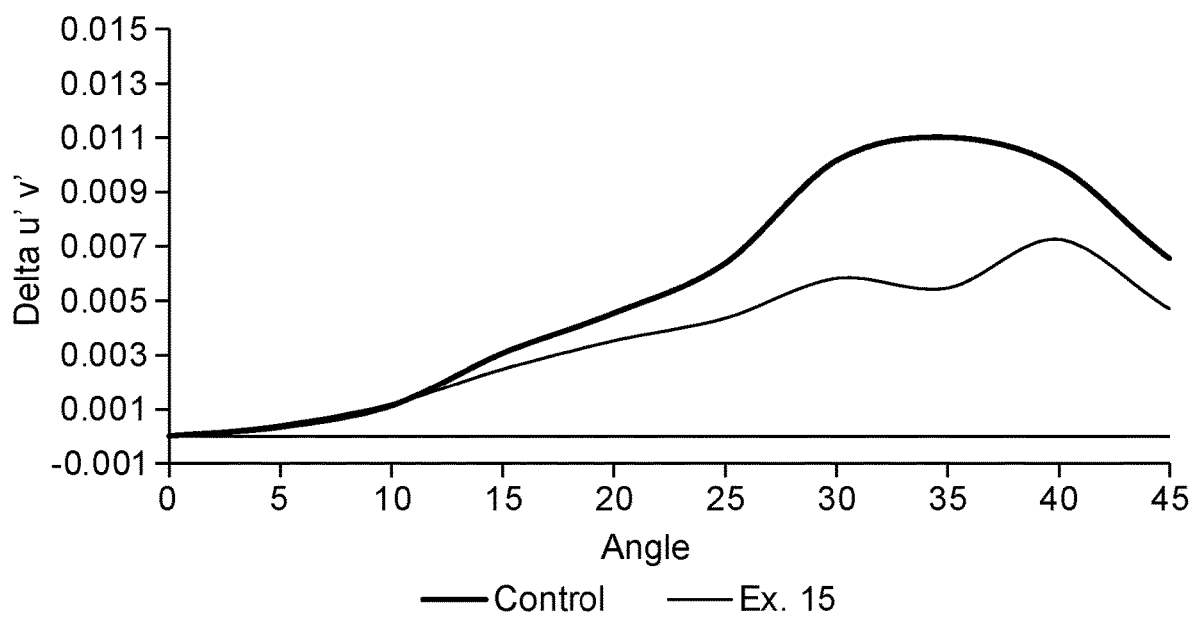
FIG. 8 is an exemplary plot of off-angle color shift (as represented by the corresponding shift in CIE (Commission on Illumination) color coordinates) versus viewing angle with and without a Wide View Color (WVC) correction polymeric film.

For each sample in this evaluation, the angular color shift (delta_u'v') of the OLED device with a Wide View Color (WVC) correction polymeric film was plotted and compared to the same OLED without a WVC correction polymeric film (control). An exemplary plot is shown in FIG. 8. The WVC correction polymeric film helps to substantially reduce the angular color shift of the OLED device. The maximum color shift from 0-45 degrees was reduced from delta_u'v'=0.012 (control) to delta_u'v'=0.07 (with polymeric film), representing a 40% reduction.

OLED Dark State Reflectivity Test Method

Figure 9:
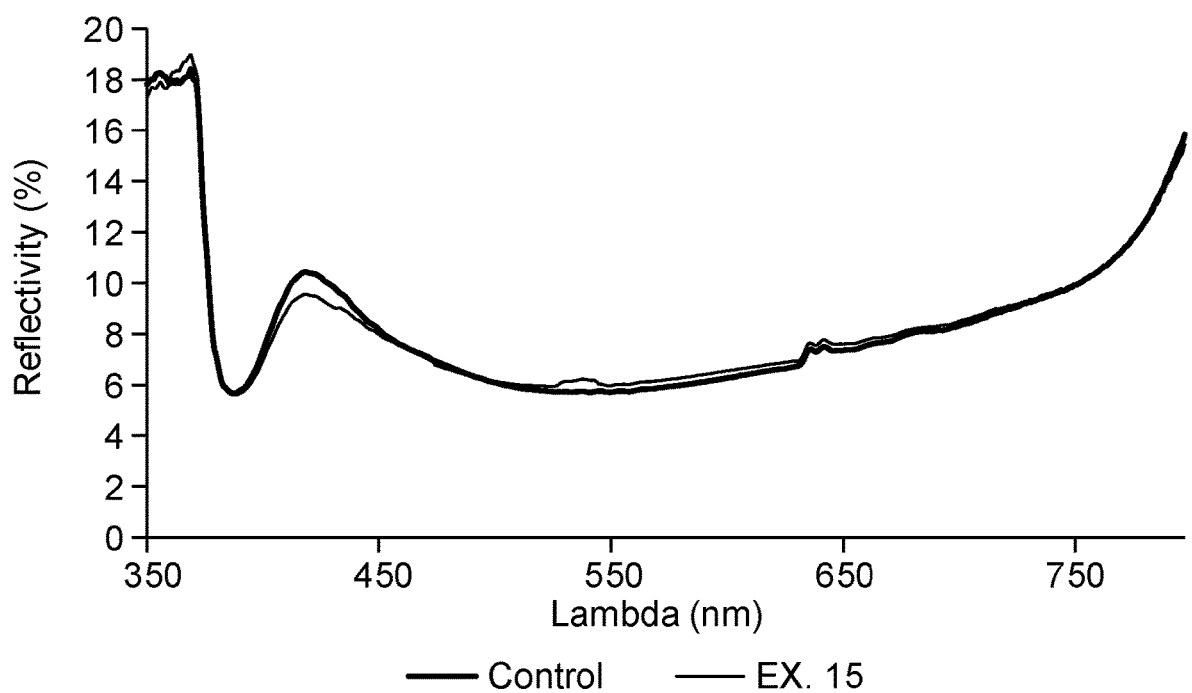
FIG. 9 is a plot of Samsung S4 specular reflectivity measured by Lambda900 with and without a WVC correction polymeric film (essentially no change in ambient reflectivity).

A mobile OLED device normally has strong specular reflection from electrode elements. To mitigate this problem, most assemblies incorporate a circular polarizer at the front surface to reduce ambient light reflection. Preferably the polymeric material incorporated into the OLED device should not depolarize and increase the ambient light reflection. For the typical OLED display system, including a circular polarizer element, it is desirable that the photopic reflectivity should not increase by more than 5% with the incorporation of the polymeric film for Wide View Color correction. To illustrate this, the specular reflectivity of the OLED device with circular polarizer was measured with and without a WVC correction polymeric film. (This particular polymeric film is later described as Example 15.) These reflectivity measurements were made with Lambda900 spectrophotometer (Perkin Elmer, Waltham, Mass.) over the wavelength range of 350 nm to 800 nm. The resulting reflectivity measurements, with and without the WVC correction polymeric film, are shown (FIG. 9) to have essentially no change in ambient reflectivity with the addition of the diffusing polymeric film. Thus, a WVC correction film of the present disclosure is compatible with a circular polarizer. By "compatible" it is meant that no more than 5% of the light is depolarized by a WVC correction polymeric film in an OLED display system.

Sample Preparation

Fabrication of Examples 1-15

In a glass jar, 400 grams (g) of OPPANOL B 10 (PIB) and 1600 g of heptane were added together. The glass jar was placed on a roller mixer for a week, resulting in a homogenous 20 wt-% stock solution.

Formulations 1-4 were prepared accordingly to Table 1 below by adding different levels of TOSPEARL 120A beads. A sample of 250 g of the 20 wt-% t PIB stock solution as prepared above was transferred to 16-ounce jars, different levels of TOSPEARL 120A beads and additional heptane were added to maintain 20 wt-% solids, then jars were sealed, and placed on a roller for an additional 4 days.

The Refractive Index (RI) of PIB was measured as 1.53 at 632 nm, and the RI of TOSPEARL 120A beads is 1.42 as reported by the vendor.

Formulations 1-4 were coated on a 3-mil (75 microns) thick RF22N liner using a 4-inch (100 mm) wide slot-type die at a line speed of 10 feet per minute (ft/min) (3.3 meters per minute), and several different flow rates to adjust the coating thickness. The tabulated values for coating thickness are estimated or approximate thicknesses based on the material and pumping speed that meters the material. The coating was dried at 200° F. (93° C.), then a 3-mil RF02N liner was laminated on the coating to keep the material clean. Using these compositions and changing the coating thickness yielded 15 examples.

TABLE 1

| Formulation Number | TOSPEARL 120A Beads (grams) | OPPANOL B10, 20 wt-% in Heptane (grams) | Additional Heptane (grams) |
|---|---|---|---|
| 1 | 1.28 | 250 | 5.12 |
| 2 | 2.63 | 250 | 10.52 |
| 3 | 5.56 | 250 | 22.24 |
| 4 | 8.82 | 250 | 35.28 |

TABLE 2

| Example Number | Formulation Number | Particle Loading (vol-%) | Pump Speed | Coating Thickness, Estimated (microns) |
|---|---|---|---|---|
| Ex 1 | 1 | 2.50% | 8 | 9.3 |
| Ex 2 | 1 | 2.50% | 10 | 11.7 |
| Ex 3 | 1 | 2.50% | 12 | 14 |
| Ex 4 | 2 | 5% | 6 | 7 |
| Ex 5 | 2 | 5% | 8 | 9.3 |
| Ex 6 | 2 | 5% | 10 | 11.7 |
| Ex 7 | 2 | 5% | 12 | 14 |
| Ex 8 | 3 | 10% | 6 | 7 |
| Ex 9 | 3 | 10% | 8 | 9.3 |
| Ex 10 | 3 | 10% | 10 | 11.7 |
| Ex 11 | 3 | 10% | 12 | 14 |
| Ex 12 | 4 | 15% | 6 | 7 |
| Ex 13 | 4 | 15% | 8 | 9.3 |
| Ex 14 | 4 | 15% | 10 | 11.7 |
| Ex 15 | 4 | 15% | 12 | 14 |

Measurement Results

TABLE 3

OLED WVC Measurement Results

| Example | Thickness (μm) | Bulk Property T (%) | Bulk Property H (%) | Bulk Property C (%) | Color Shift Δ(u', v') (<45°) | Shift Reduction (%) |
|---|---|---|---|---|---|---|
| Ex 1 | 9.3 | 92.5 | 13.4 | 99.1 | 0.0097 | 12% |
| Ex 2 | 11.7 | 92.4 | 14.7 | 99 | 0.0099 | 10% |
| Ex 3 | 14 | 92.6 | 16.7 | 98.8 | 0.0098 | 11% |
| Ex 4 | 7 | 92.5 | 17.1 | 99.2 | 0.0095 | 14% |
| Ex 5 | 9.3 | 92.3 | 21.1 | 98.4 | 0.0098 | 11% |
| Ex 6 | 11.7 | 92.7 | 25.6 | 98 | 0.0091 | 17% |
| Ex 7 | 14 | 92.5 | 28.9 | 97.3 | 0.0092 | 16% |
| Ex 8 | 7 | 92.3 | 30.9 | 98.3 | 0.0097 | 12% |
| Ex 9 | 9.3 | 92.6 | 36.4 | 96.2 | 0.0088 | 20% |
| Ex 10 | 11.7 | 92.8 | 42.1 | 94.3 | 0.0079 | 28% |
| Ex 11 | 14 | 92.7 | 45.9 | 91.5 | 0.0077 | 30% |
| Ex 12 | 7 | 92.5 | 40.4 | 96.4 | 0.0079 | 28% |
| Ex 13 | 9.3 | 92.7 | 46.4 | 91.3 | 0.0076 | 31% |
| Ex 14 | 11.7 | 93 | 56.5 | 91.2 | 0.0078 | 29% |
| Ex 15 | 14 | 92.8 | 62.8 | 91 | 0.0073 | 34% |
| Control (Ex 1-15) | 25 | 92.2 | 0.67 | 99.8 | 0.0110 | |

The complete disclosures of the patents, patent documents, and publications cited herein are incorporated by reference in their entirety as if each were individually incorporated. Various modifications and alterations to this disclosure will become apparent to those skilled in the art without departing from the scope and spirit of this disclosure. It should be understood that this disclosure is not intended to be unduly limited by the illustrative embodiments and examples set forth herein and that such examples and embodiments are presented by way of example only with the scope of the disclosure intended to be limited only by the claims set forth herein as follows.

What is claimed is:

1. A polymeric film comprising:
a first polymeric layer having two major surfaces, wherein the first polymeric layer comprises:
a first polyolefin-based low WVTR adhesive polymeric matrix having a refractive index $n_1$; and
particles having a refractive index n2 uniformly dispersed within the first polymeric matrix; and
a second polymeric layer disposed directly on one major surface of the first polymeric layer with no intervening layer; wherein the second polymeric layer comprises a second polymeric matrix having a refractive index $n_3$; wherein the first polymeric matrix and the second polymeric matrix are the same or different
wherein the particles are present in an amount of less than 30 vol-%, based on the volume of the first polymeric layer, and have a particle size range of 400 nm to 3000 nm; and
wherein $n_1$ is different than $n_2$;
wherein the polymeric film has:
a clarity of at least 80%;
a visible light transmission of at least 85%; and
a bulk haze of 15% to 80%.

2. The polymeric film of claim 1 wherein the second polymeric matrix comprises an adhesive matrix.

3. The polymeric film of claim 2 wherein the first adhesive matrix is different than the second adhesive matrix.

4. The polymeric film of claim 3 wherein $n_1$ is within 0.2 unit of $n_3$.

5. The polymeric film of claim 1 wherein the second polymeric layer has a thickness of at least 25 microns.

6. The polymeric film of claim 1 wherein at least one adhesive matrix comprises an optically clear adhesive.

7. The polymeric film of claim 1 wherein the particles have a particle size range of 700 nm to 2.0 microns.

8. The polymeric film of claim 1 wherein the particles are present in the first polymeric matrix in an amount of at least 0.5 vol-%, and up to 25 vol-%, based on the total volume of the first polymeric layer.

9. The polymeric film of claim 1 wherein the first polymeric layer has a thickness of at least 10 microns and up to 100 microns.

10. The polymeric film of claim 1 wherein the polymeric film has a thickness of at least 10 microns and up to 130 microns.

11. The polymeric film of claim 1 wherein the particles comprise an organic polymeric material selected from a polydimethylsiloxane (PDMS), a polyurethane, a polymethyl methacrylate (PMMA), a polystyrene, or a combination thereof.

12. The polymeric film of claim 1 wherein $n_1$ is 0.01 to 0.5 unit different than $n_2$.

13. The polymeric film of claim 1 wherein the polyolefin-based polymer matrix comprises a tackified polyolefin elastomer, an olefin block copolymer, or an alpha-olefin copolymer.

14. The polymeric film of claim 1 wherein the first polymeric matrix comprises polyisobutylene.

15. A display device comprising:
- an organic light emitting diode panel having a multi-layer construction comprising one or more adhesive films; and
- a polymeric film of claim 1 incorporated within the multi-layer construction of the organic light emitting diode panel;
- wherein the polymeric film comprises at least one adhesive matrix; and wherein the display device has an off-axis color shift (0-45°) that is at least 5% better than an off-axis color shift compared to a like display device that includes a non-diffusive optically clear adhesive in place of the polymeric film.

16. The device of claim 15 which is flexible or rigid.

17. A display device comprising:
- an organic light emitting diode panel having a multi-layer construction comprising one or more adhesive films; and
- a polymeric film of claim 1 incorporated within the multi-layer construction of the organic light emitting diode panel;
- wherein the polymeric film comprises at least one adhesive matrix; and wherein the display device has an off-axis color shift (0-60°) that is at least 5% better than an off-axis color shift compared to a like display device that includes a non-diffusive optically clear adhesive in place of the polymeric film.

* * * * *

UNITED STATES PATENT AND TRADEMARK OFFICE
CERTIFICATE OF CORRECTION

| | |
|---|---|
| PATENT NO. | : 11,522,025 B2 |
| APPLICATION NO. | : 16/610710 |
| DATED | : December 6, 2022 |
| INVENTOR(S) | : Encai Hao |

It is certified that error appears in the above-identified patent and that said Letters Patent is hereby corrected as shown below:

In the Claims

<u>Column 20</u>
Line 18, In Claim 1, delete "n2" and insert -- $n_2$ --, therefor.

Signed and Sealed this
Thirty-first Day of October, 2023

Katherine Kelly Vidal
*Director of the United States Patent and Trademark Office*